United States Patent [19]

Tatsumi et al.

[11] Patent Number: 5,385,863

[45] Date of Patent: Jan. 31, 1995

[54] METHOD OF MANUFACTURING POLYSILICON FILM INCLUDING RECRYSTALLIZATION OF AN AMORPHOUS FILM

[75] Inventors: Toru Tatsumi; Akira Sakai, both of Tokyo, Japan

[73] Assignee: NEC Corporation, Tokyo, Japan

[21] Appl. No.: 901,071

[22] Filed: Jun. 19, 1992

[30] Foreign Application Priority Data

Jun. 21, 1991 [JP] Japan .................................. 3-149128
Jul. 10, 1991 [JP] Japan .................................. 3-168541
Jul. 18, 1991 [JP] Japan .................................. 3-178232

[51] Int. Cl.$^6$ .................. H01L 21/285; H01L 21/324
[52] U.S. Cl. ............................ 437/109; 437/233; 437/919; 437/977
[58] Field of Search ............... 437/47, 52, 60, 101, 437/109, 82, 235, 233, 967, 919, 977; 148/DIG. 14, DIG. 122, DIG. 138

[56] References Cited

U.S. PATENT DOCUMENTS 3,864,817 2/1975 Lapham, Jr. et al. .............. 437/919
4,358,326 11/1982 Doo ..................................... 437/109
4,379,020 4/1983 Glaeser et al. ...................... 437/233
4,814,292 3/1989 Sasaki et al. .
5,275,851 1/1994 Fonash et al. .
5,278,093 1/1994 Yonehara .

FOREIGN PATENT DOCUMENTS

62-124731 6/1987 Japan .
63-283013 11/1988 Japan .
148411 2/1989 Japan .
2130009A 5/1984 United Kingdom .
2171844 9/1986 United Kingdom .

Primary Examiner—George Fourson
Attorney, Agent, or Firm—Burns, Doane, Swecker & Mathis

[57] ABSTRACT

A method of fabricating a polysilicon film whose crystal grain size can be controlled in a wide range and which has a large surface area and an application thereof to a DRAM are disclosed. In polycrystallizing an amorphous silicon film having a substantially clean surface, nucleation and crystal growth are performed under different conditions. With this method, crystal grain density and crystal grain size can be controlled easily, causing a polysilicon film having finer grains to be formed concomitant with reduction of capacitor area due to increase of integration density of DRAM.

7 Claims, 11 Drawing Sheets

METHOD OF MANUFACTURING POLYSILICON FILM INCLUDING RECRYSTALLIZATION OF AN AMORPHOUS FILM

BACKGROUND OF THE INVENTION

The present invention relates to a method of manufacturing a semiconductor device and, particularly, to a method of manufacturing a polysilicon film suitable for use as a capacitor electrode.

With the recent increase of integration density of a DRAM, a cell size and an area to be occupied by a capacitor of the DRAM cell tend to reduce, respectively. In order to keep a capacitance of such capacitor at an acceptable value, a stacked capacitor or a trench stacked capacitor has been used since it can provide a large capacitor area therein, has a anti-alpha ray characteristics and is capable of reducing interference between DRAM cells. For a DRAM of 64 Mbits, a cell area is estimated as 2 $\mu m^2$ or less. When such capacitor as mentioned above is incorporated in such DRAM, a silicon oxide film as thin as 50 Å is required as a dielectric film of the capacitor. It is very difficult to form such thin silicon oxide film on a whole chip uniformly without defects. Therefore, it has been proposed to increase the above-mentioned area of the capacitor portion while keeping a thickness of the capacitor insulating film as it is.

Watanabe et al. discloses in U.S. patent application Ser. No. 07/672,073 (assigned to the assignee of this application) that, by lowering temperature in forming a polysilicon film by LPCVD from 600° C. which has been used conventionally to about 550° C., dense crystal grains each having hemisphere shape grow on a surface of a substrate in a boundary region thereof in which amorphous silicon is transferred to polysilicon, resulting in a surface area of the polysilicon film twice that grown at 600° C. In Watanabe et al., a sufficient capacitance value and low leak current value are obtained with a silicon oxide film 100 Å thick by applying such polysilicon film to a charge storage electrode of a stacked capacitor. However, according to the method of Watanabe et al., temperature at which such hemisphere crystal grains grow on the surface is limited to a very narrow range from 545° C. to 555° C. Therefore, it is very difficult to control growing temperature within such small range as 10° C. for mass production. Further, when, in order to isolate between adjacent capacitors, dry-etching is performed after such polysilicon film formation, a side wall portion of the storage electrode is flattened by etching, raising a problem in realizing a large capacitance value. As another prior art, Tatsumi discloses in Japanese Patent Application No. 2-249154 (filed on Sep. 19, 1990 and assigned to the assignee of this application) that a polysilicon film containing hemisphere or mushroom shaped crystal grains is obtained by forming an amorphous silicon film and heating it in vacuum condition. A sufficient capacitance value and low leak current value are obtained with a silicon oxide film 100 Å thick by applying such polysilicon film to an electrode of a stacked capacitor. Further, Sakai discloses in Japanese Patent Application No. 3-067657 (filed on Mar. 8, 1991 and assigned to the assignee of this application) and in Japanese Patent Application No. 3-073693 (filed on Mar. 14, 1991 and assigned to the assignee of this application) that a polysilicon film containing hemisphere or mushroom shaped crystal grains is grown epitaxially in solid phase by heating a wafer in high vacuum condition immediately after a natural oxide film formed on a surface of an amorphous silicon film on the wafer due to atmospheric oxidation is removed by using fluoric acid solution or by ion sputtering.

That is, crystal nucleation is performed on a surface of an amorphous silicon film and nuclei thus produced grown when it is heated at a constant temperature in a range from 550° C. to 700° C. Since surface diffusion rate of silicon on a clean amorphous silicon film surface is very high compared with growing rate of slid phase epitaxy, silicon is concentrated to the nuclei by surface diffusion and thus mushroom shaped crystal grains are obtained. An upper limit of grain size is determined at a time when grains grow to the extent that adjacent grains become in contact with each other. Thus, an average grain size depends upon density of crystal nuclei produced by nucleation in a unit time, that is, nucleation rate. In other words, the average grain size is determined by a substrate temperature in an initial stage of substrate heating. The higher the substrate temperature results in the higher the nucleation rate and thus the smaller the average grain size. However, since activation energy of crystal nucleation of amorphous silicon film is larger than activation energy of surface diffusion of silicon atoms, crystal may grow rapidly before crystal nuclei density becomes enough even if the substrate temperature is increased for the purpose of reducing average grain size. Therefore, it is difficult to obtain a polysilicon film having small enough grain size. Further, variation of grain size is also increased. In addition, since atom migration becomes large with increase of temperature, grain shape becomes relatively smooth and flat compared with hemisphere shape.

As an example, it is possible to obtain a polysilicon film having average grain size of about 1500 Å at substrate temperature of 650° C. When a capacitor electrode area is reduced to 2 $\mu m^2$, the number of crystal grains formed on the capacitor electrode may vary. A capacitance value is twice at most compared with that with flat electrode surface and about 1.5 times in average.

As described, since, according to the conventional technique, the generation and growth of crystal nuclei are performed at a constant temperature, it is very difficult to form a polysilicon film having small enough grain size and large enough surface area with acceptable reproducibility.

SUMMARY OF THE INVENTION

Accordingly, an object of the present invention is to provide a manufacturing method of a semiconductor device having a polysilicon film whose surface area is large and whose crystal nuclei density and crystal grain size are controllable over wide ranges, respectively.

The present invention includes the steps of depositing an amorphous silicon film on a desired interlayer insulating film of a semiconductor chip, nucleating a clean surface of the amorphous silicon film under predetermined conditions and allowing nuclei thus produced to grow under other conditions. The term "clean surface" means a state of surface such as as-grown surface of a film formed by MBE, surface of a film which is exposed only to an inert gas such as nitrogen or argon after a formation of the film, surface whose natural oxide film formed after film formation is removed by fluoric acid solution to terminate the surface with hydrogen atom or fluorine atom and which is then heated to a temperature lower than a crystallization temperature of amorphous silicon film in vacuum or inert gas to separate hydrogen atom or fluorine atom, or surface after natural oxide film is removed by irradiation of rare gas ions such as argon.

In a first embodiment of the present invention, crystal nuclei are produced on an amorphous silicon film by heating the latter and then the crystal nuclei are allowed to grow by decreasing temperature. Average grain size of a polysilicon film depends upon nucleation rate which corresponds to density of crystal nuclei generated in a unit time and crystal growing rate. The higher the heating temperature results in the higher the nucleation rate as well as the crystal growing rate. Density of crystal nuclei increases with time at nucleation rate which depends upon the substrate temperature. However, when the crystal growing rate exceeds the crystal nucleation rate, generation of new crystal nuclei is blocked by already grown crystal nuclei. Therefore, a control of crystal grain size is facilitated by making heating temperature for crystal nucleation high, heating time short and temperature for crystal growth low.

In a second embodiment of the present invention, crystal nucleation is performed by exposing an amorphous silicon film to silicon compound gas for a predetermined constant time while keeping it at a predetermined temperature and crystal nuclei produced are allowed to grow by continuously heating the film without exposing it to the silicon compound gas. Since silicon compound is decomposed at dangling bond in the amorphous silicon film surface to produce crystal nuclei, nucleation rate becomes higher than that obtained only by heating, facilitating control of crystal grain size and enabling finer crystal grains to be formed.

In a third embodiment of the present invention, nucleation is performed by irradiating an amorphous silicon film with silicon molecular beam for a predetermined time while keeping the film at a predetermined temperature and crystal nuclei thus produced are allowed to grow by continuously heating the film without irradiation of silicon molecular beam. Since there is no chemical reaction used, it is possible to perform nucleation at a lower temperature.

Since it is possible to realize a capacitor having large capacitance per unit area with high reproducibility by forming a dielectric film on a polysilicon film having large surface area and forming a conductive film thereon, it is possible to further increase integration density of DRAM.

BRIEF DESCRIPTION OF THE DRAWINGS

The above-mentioned and other objects, features and advantages of the present invention will become more apparent by reference to the following detailed description of the present invention taken in conjunction with the accompanying drawings, wherein.

DETAILED DESCRIPTION OF THE PREFERRED EMBODIMENTS

A first embodiment of the present invention will be described with reference to FIGS. 1(a) to 1(e).

Figure 1A:
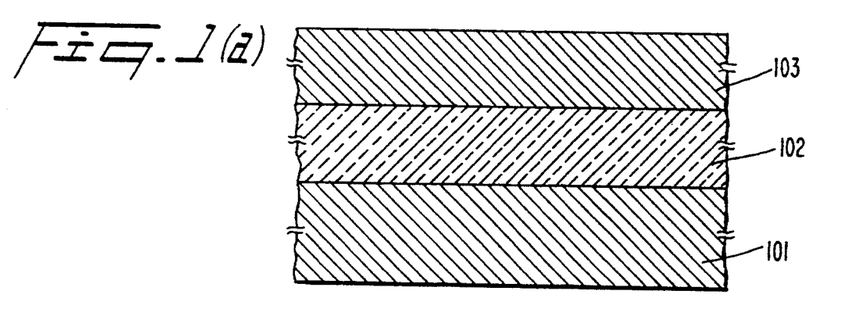
FIG. 1(a) is a cross section of a semiconductor chip for explanatory purpose of a first embodiment of the present invention.

As shown in FIG. 1(a), a silicon oxide film 102 having thickness of 2000 Å is formed on a surface of a silicon substrate 101 having diameter of 4 inches by thermal oxidation. Then the substrate is inserted into a molecular beam epitaxy (MBE) apparatus and irradiated with silicon molecular beam from an electron gun type silicon evaporator at irradiation rate of 7 Å/sec and the substrate being at room temperature to form an amorphous silicon film 103 having thickness of 4000 Å. Thereafter, phosphor ion is implanted thereto at density of $5 \times 10^{15}$ cm$^{-2}$ with acceleration voltage of 50 keV.

Figure 1B:
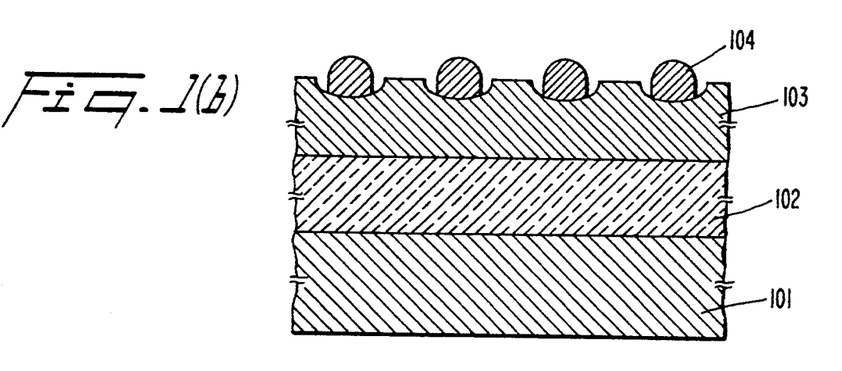
FIG. 1(b) is a cross section of a semiconductor chip for explaining a step subsequent to the step corresponding to FIG. 1(a)
Figure 1C:
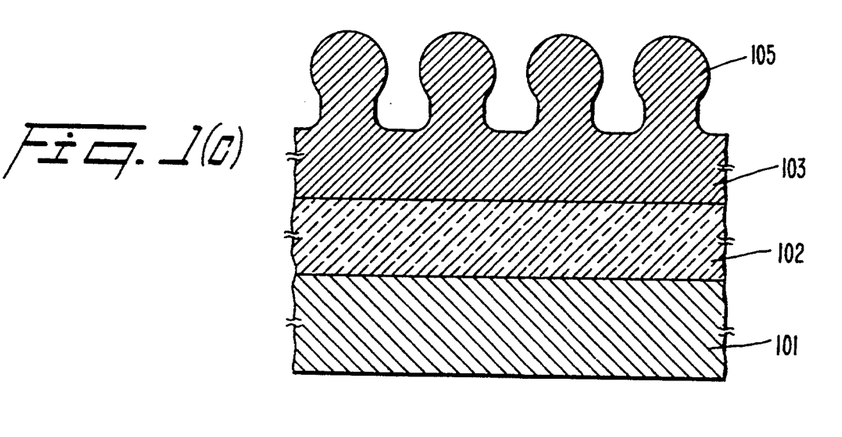
FIG. 1(c) is a cross section of a semiconductor chip for explaining a step subsequent to the step corresponding to FIG. 1(b)
Figure 2:
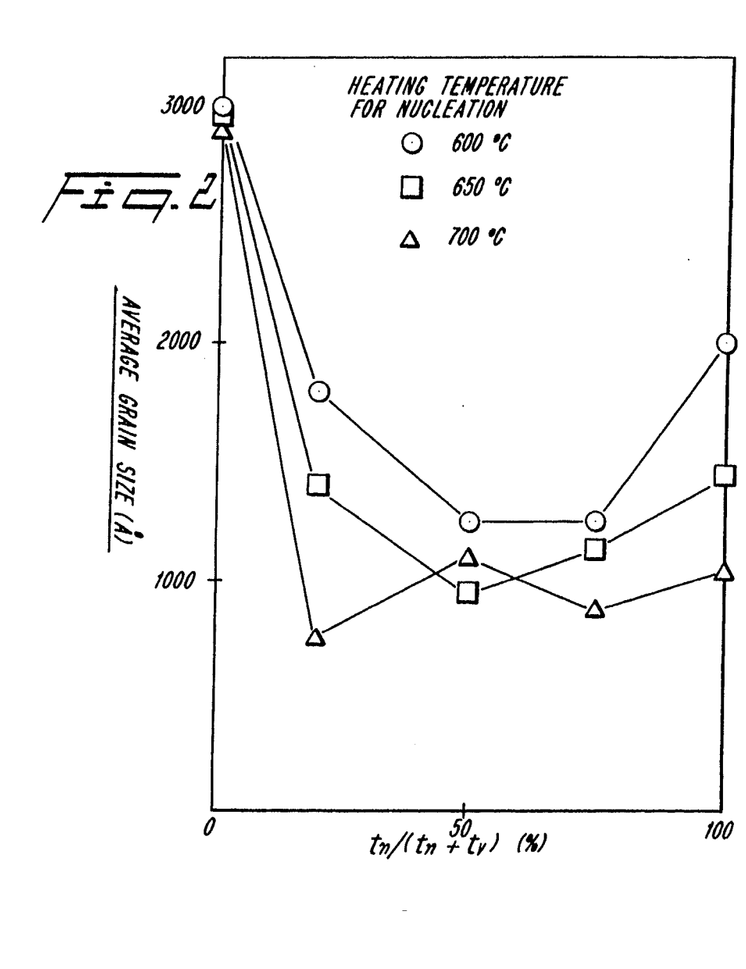
FIG. 2 is a graph showing a relation between average grain size and a ratio of heating time for nucleation to a whole heating time in the first embodiment of the present invention.

With lamp heating thereafter, crystal nuclei 104 are produced as shown in FIG. 1(b). The nucleation process was performed at heating temperatures of 600° C., 650° C. and 700° C., respectively. Heating at each temperature was performed over heating time of 0 min, 5 min, 10 min and 20 min, respectively. With heating at 550° C. for time tv after the nucleation process, mushroom shaped or hemisphere shaped crystal grains 105 forming a concavo-convex surface were obtained as shown in FIG. 1(c). FIG. 2 shows a relation between average grain size and ratio of nucleation time tn to the total heating time (tn/(tn+tv)) when the total heating time (tn+tv) is set to 20 min. The leftmost data correspond to a case where polycrystallization is performed at a constant temperature of 550° C. and the rightmost data correspond to a case where polycrystallization is performed at a constant temperature of 600° C., 650° C. and 700° C., respectively. It is clear from FIG. 2 that average crystal grain size can be made smaller when nucleation and growth are performed at different temperatures and/or when heating temperature is higher.

Average grain size of crystals formed by polycrystallization of an amorphous silicon film depends upon density of nuclei produced in a unit time, that is, nucleation rate, and growing rate of the nuclei. The higher the heating temperature results in the higher the nucleation rate. In that case, however, the growing rate of nuclei also increases. Density of nuclei increases with increase of nucleation rate which depends upon substrate temperature. When nuclei growing rate exceeds nucleation rate, existing nuclei grow prior to new nucleation, resulting in that nucleation can not occur any more. Therefore, in order to form fine crystal grain, it may be enough to increase heating temperature for nucleation, reduce nucleation time tn and lower heating time tv for crystal nuclei growth to a value lower than tn at which nucleation rate is small enough. Further, preferably, temperature control therefor should be sharp to heat/cool rapidly.

Although, in FIG. 1(c), polysilicon grains 105 are shown as having uniform mushroom shape, they may be not uniform in shape and in size, practically.

Figure 1D:
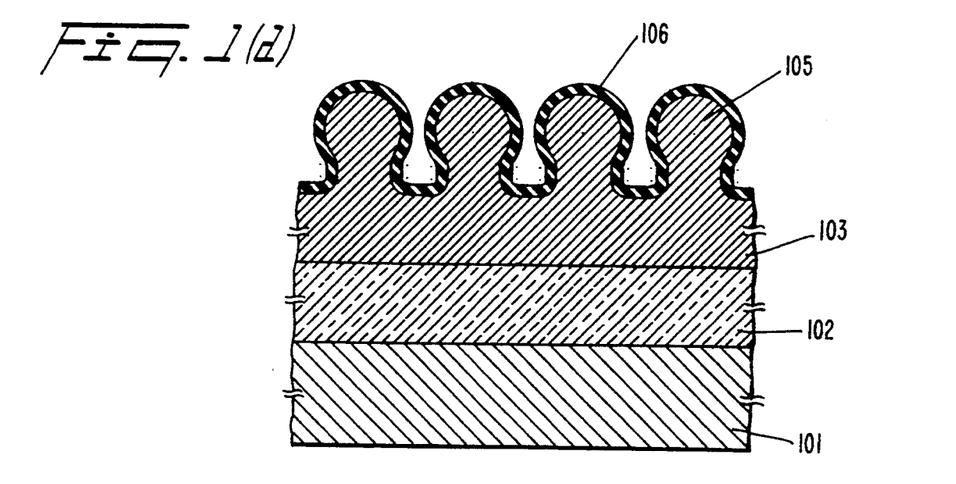
FIG. 1(d) is a cross section of a semiconductor chip for explaining a step subsequent to the step corresponding to FIG. 1(c)

Then, as shown in FIG. 1(d), a silicon nitride film was formed by Low Pressure CVD (LPCVD) and a surface thereof was oxidized to form a capacitor insulating film 106 having a concavo-convex surface. Thickness of this capacitor insulating film 106 is selected to any suitable value in a range from 30 Å to 100 Å in SiO$_2$ film equivalent.

Figure 1E:
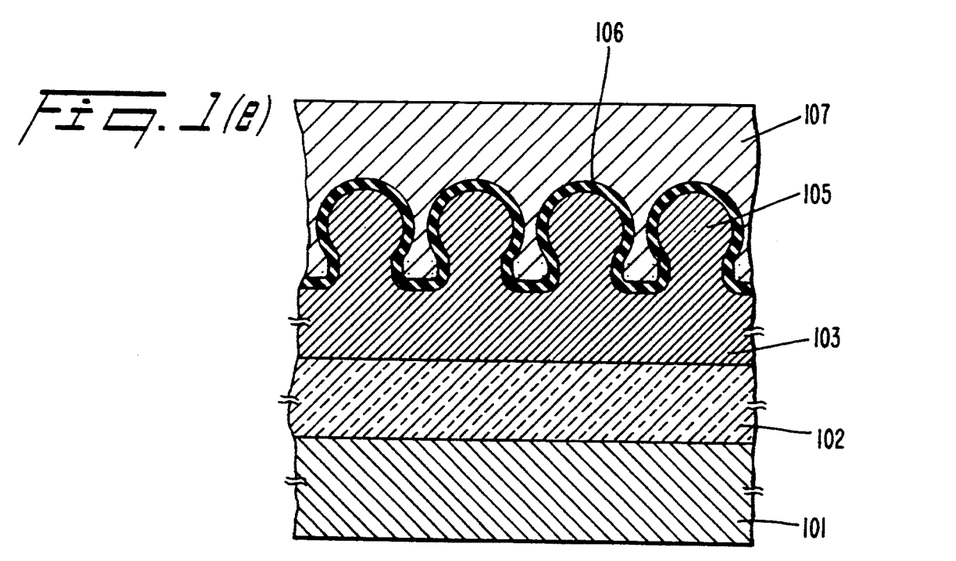
FIG. 1(e) is a cross section of a semiconductor chip for explaining a step subsequent to the step corresponding to FIG. 1(d)
Figure 3:
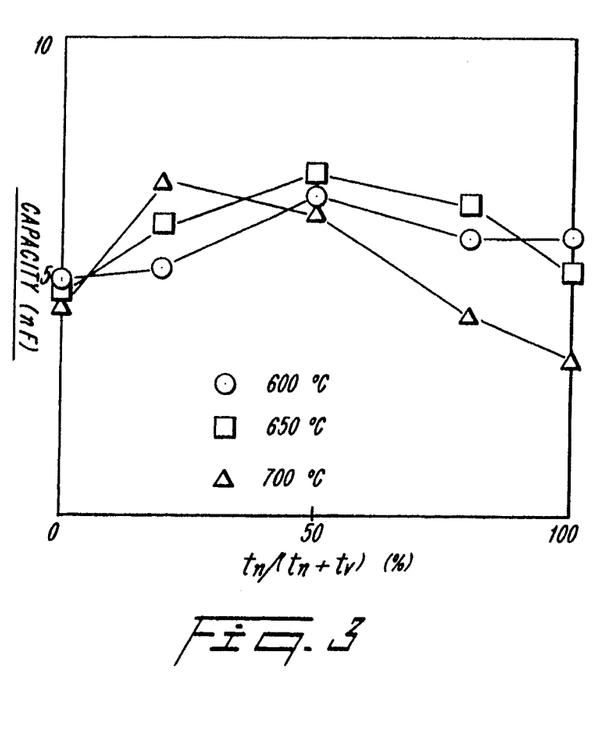
FIG. 3 is a graph showing a relation between capacitance value of a capacitor and a ratio of heating time for nucleation to a whole heating time in the first embodiment of the present invention.

Thereafter, as shown in FIG. 1(e), a polysilicon film 107 was deposited thereon and doped with phosphorus. Then, the polysilicon film was patterned to form an electrode and a capacitor 1 mm×1 mm wide was formed, whose capacitance was measured. A result is shown in FIG. 3. In this case, the thickness of the capacitor insulating film 106 was 100 Å in SiO$_2$ film equivalent. It is clear from FIG. 3 that capacitance of the capacitor generally increases with decrease of average grain size.

Although, this embodiment was described with a silicon wafer as the substrate, the present invention is, of course, likely applicable to an SOS (Silicon-on-Saphire) substrate in which silicon exists in only a surface region thereof or even generally to an SOI (Silico-on-Insulator) substrate, etc. Further, although the amorphous silicon film is formed in the MBE apparatus with using electron gun type silicon deposition equipment, it can be formed by LPCVD or sputtering. It has been confirmed that effect similar to that obtained by the described embodiment is obtained for an amorphous silicon film formed by these other methods after removal of a natural oxide film on a surface thereof. Pressure in the forming apparatus is not always ultra high vacuum pressure. It is important, however, to heat the amorphous silicon film while a surface thereof being kept clean. It has been confirmed that similar phenomena to those occured in the described embodiment occur when the treatment is done within atmosphere of non-reactive gas to the amorphous silicon surface, such as nitrogen gas or helium gas. Heating is not limited to lamp heating so long as heating and cooling can be done rapidly.

Figure 4:
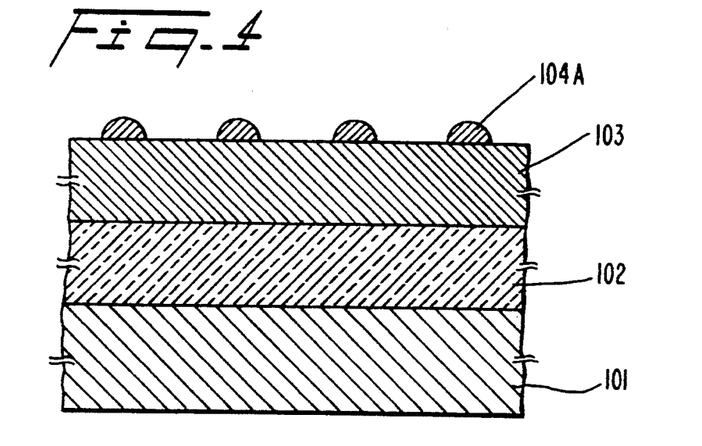
FIG. 4 is a cross section of a semiconductor chip for explaining nucleation in a second embodiment of the present invention.

A second embodiment of the present invention will be described. As in the first embodiment, an amorphous silicon film having thickness of 4000 Å is formed by MBE or LPCVD and ion-implanted with phosphorus. After contamination on a surface of the amorphous silicon film is removed by dipping it in washing liquid (60° C.) which is a mixture of NH$_4$OH, H$_2$O$_2$ and H$_2$O in a ratio of 1:6:20, the film is dipped in 5% fluoric acid solution for 30 seconds to remove a natural oxide film. The wafer is dried by a centrifugal separator or dried nitrogen gas and then inserted into a forming chamber of a ultra high vacuum CVD equipment having a Si$_2$H$_6$ supply nozzle. The forming chamber is kept at $10^{-9}$ Torr and has a substrate heating equipment such as a graphite heater. First, the substrate is heated to a certain constant temperature, preferrably, temperature as low as 500° C. to 620° C. at which nucleation does not occur rapidly, and then, by supplying Si$_2$H$_6$ to the forming chamber at flow-rate of 13 sccm, nuclei 104A such as shown in FIG. 4 are generated. Nucleation can be confirmed by in-situ observation using reflection HEED (RHEED). Si$_2$H$_6$ gas is decomposed at dangling bond existing in a clean surface of the amorphous silicon film, resulting in polysilicon nuclei on the surface at higher density than that obtained conventionally.

Figure 5:
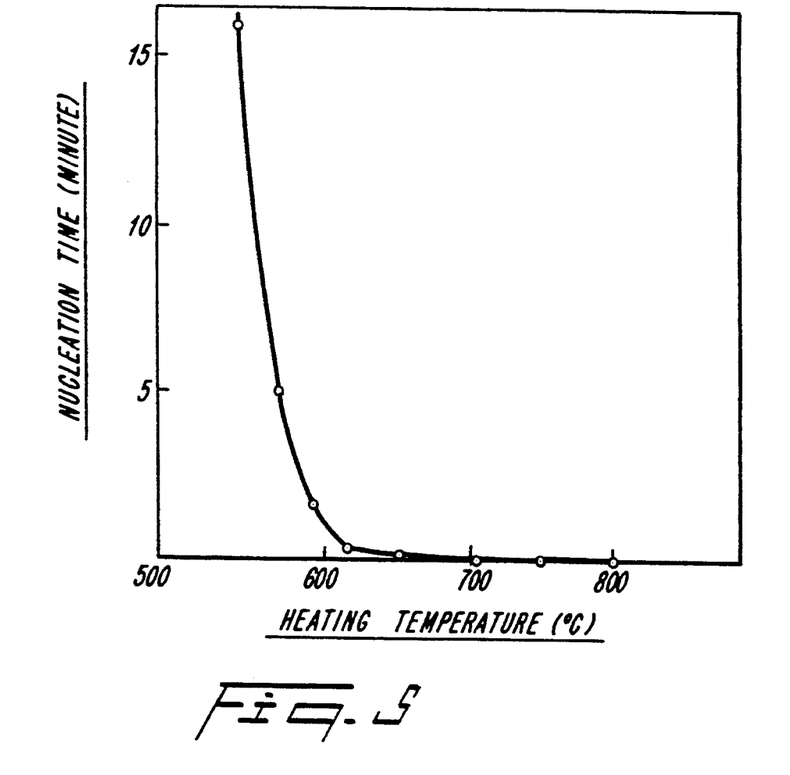
FIG. 5 is a graph showing a relation between nucleation time and heating temperature in the second embodiment of the present invention.

FIG. 5 shows a relation between time before nucleation is confirmed (nucleation time) and heating temperature. From FIG. 5, it is clear that nucleation time is very long at a temperature below 500° C. while crystal nuclei are produced rapidly at a temperature above 650° C. After the substrate is exposed to the gas for a constant time, heat treatment is continued underhigh vacuum pressure to grow the nuclei. When heating temperature is changed from 540° C. to 800° C., unevenness of the substrate surface due to crystal grains of hemisphere shape or mushroom shape is still confirmed although nucleation time is changed, as shown in FIG. 5. That is, nucleation is observed over a large temperature range. At a temperature above 650° C., both nucleation and subsequent crystal growth of small grains having large surface area are occured very rapidly. However, when heating continues, the surface unevenness of polysilicon film becomes small. Therefore, it is preferable to use the equipment capable of heating and cooling rapidly for control of the surface configuration of the substrate.

Even at low temperature at which nucleation does not occur rapidly, surface diffusion rate of silicon atoms at a clean surface of amorphous silicon film is very high compared with solid phase growing rate. Silicon atoms are concentrated to crystal nuclei formed on its surface by surface diffusion, resulting in fine, mushroom shaped crystal grains. When the reaction is continued further, grown crystal grains become in contact with each other. Since there is no feed of silicon atoms from the amorphous silicon due to surface diffusion at a boundary between the adjacent grains, growth of crystal grains is terminated, resulting in hemisphere shaped grains on the substrate surface. Since grain size of the grown crystal is smaller compared with that when grain is formed only by heating because original nuclei density is high and growth is performed at low temperature, resultant grain shape becomes close to real hemisphere.

Figure 6:
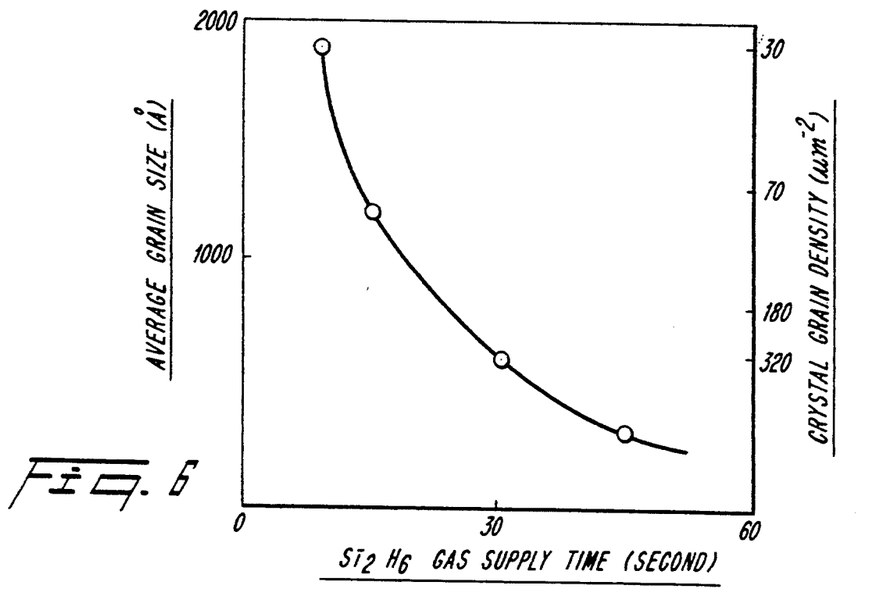
FIG. 6 is a graph showing a relation between average crystal grain size and irradiation time with $Si_2H_6$ gas in the second embodiment of the present invention.

FIG. 6 shows a relation between $Si_2H_6$ gas supply time and average grain size of hemisphere crystal grains when heating is performed at 600° C. for a constant time of 45 seconds. From FIG. 6, it is clear that grain size is in inverse proportion to $Si_2H_6$ gas supply time. This is because a number of nuclei are produced on a surface as crystal seeds, the number being in proportion to $Si_2H_6$ gas supply time and grow to mushroom or hemisphere shape. However, supply of $Si_2H_6$ gas beyond 45 seconds makes adjacent crystal grains too close to each other, resulting in insufficient surface unevenness. For gas supply for 45 seconds, it is possible to make grain size smaller down to 300 Å.

Figure 7:
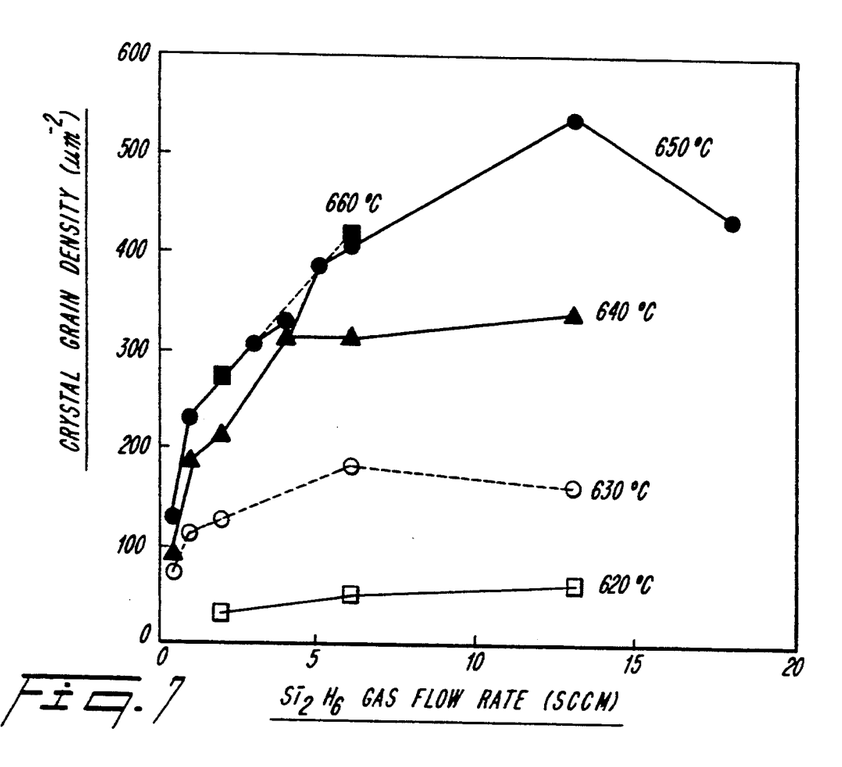
FIG. 7 is a graph showing a relation between crystal grain density and flow rate of $Si_2H_6$ gas in the second embodiment of the present invention.

Crystal grain density also has a dependency on flow rate of $Si_2H_6$ gas. FIG. 7 shows a relation between flow rate of $Si_2H_6$ gas and crystal grain density when gas supply time is 5 seconds and heating time is 45 seconds. When flow rate of $Si_2H_6$ gas exceeds a certain constant value, crystal grain density becomes substantially constant. This phenomenon can be explained in such a way that a predominant portion of hydrogen atoms boned to amorphous silicon film surface due to washing with aqueous solution of fluoric acid becomes free therefrom by heating. Such reaction rate determining region should be utilized in view of controls of crystal grain density and grain size.

Figure 8:
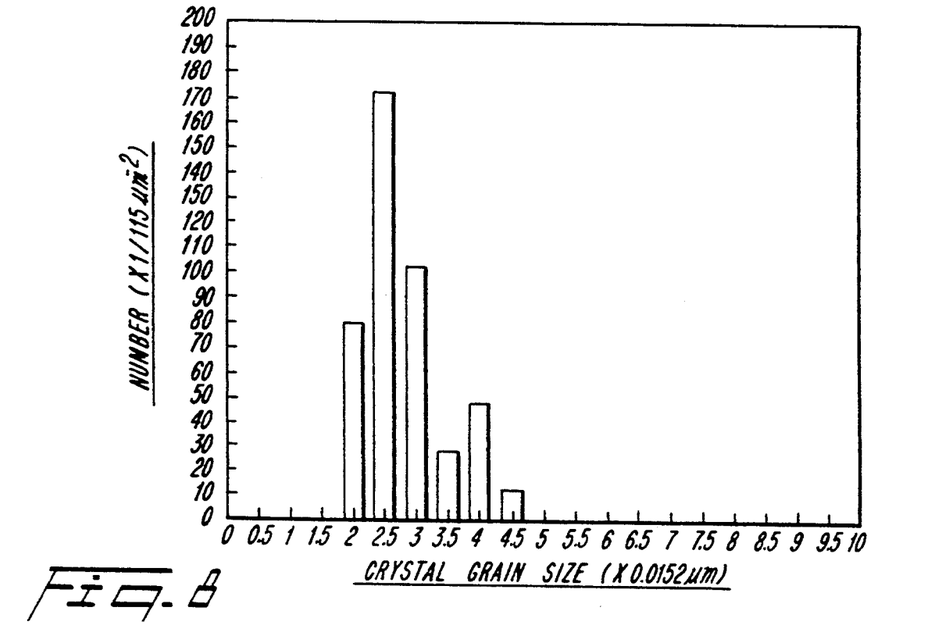
FIG. 8 is a graph showing a distribution of crystal grain size in the second embodiment of the present invention.

FIG. 8 shows a distribution of crystal grain size when $Si_2H_6$ gas at 600° C. is supplied at flowrate of 2 sccm for 80 seconds. Heating time was 80 seconds. From FIG. 8, it can be said that distribution range is relatively narrow.

Thereafter, a capacitor insulating film is formed in a similar manner to that used in the first embodiment. In this case, it is preferable that there is enough distance between adjacent crystal grains 105 so that they do not contact with each other by the capacitor insulating film. This can be achieved by controlling heating time.

Figure 9:
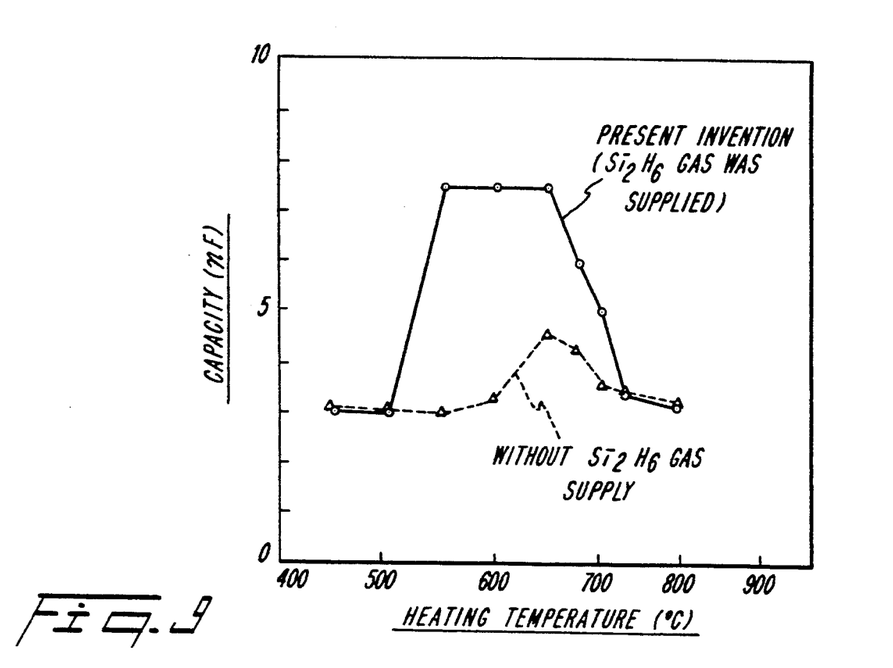
FIG. 9 is a graph showing a relation between capacitance value of a capacitor and heating temperature in the second embodiment of the present invention.

FIG. 9 shows a relation between capacitance of the capacitor and heating temperature. Thickness of the capacitor insulating film is 100 Å in $SiO_2$ equivalent and area thereof is 1 mm×1 mm. Data shown in FIG. 9 is the best one among those obtained by experiments performed by varying flow rate of $Si_2H_6$ gas and gas supply time at respective heating times. Data obtained under the same conditions without $Si_2H_6$ gas supply is shown for comparison purpose.

From FIG. 9, it is clear that, when $Si_2H_6$ gas is supplied, an increase of capacitance value of the capacitor starts at a lower temperature than that for the case where no $Si_2H_6$ gas is supplied. This is because, when $Si_2H_6$ gas is supplied, nucleation occurs at low temperature. The increase of capacitance value is 2.5 times at a temperature from 540° C. to 650° C. and is smaller outside this range. It should be noted that, although, as mentioned previously, heating must be terminated within a short time when high temperature heating is used, the substrate heating equipment used in this embodiment had no facility of doing so and thus the substrate surface was smoothened. On the other hand, when only heating is performed, capacitance is peaked at 650° C., the value being much smaller compared with the present invention. This is due to the fact that surface configuration becomes smooth by high temperature heating as in the case of the nucleation with gas. Such smoothing of surface configuration at high temperature in both cases may be prevented by using a heating equipment such as lamp heater which can heat/cool rapidly and reducing heating time.

According to this embodiment, it is possible to form a polysilicon film of finer grain size compared with that obtained by the first embodiment and thus to realize capacitance increase in the wide temperature range of heating.

Although this embodiment has been described with using silicon wafer as the substrate, the present invention is also applicable to an SOS substrate in which silicon exists in only a surface region and even to an SOI substrate, generally. Further, although, in this embodiment, the amorphous silicon film is nucleated by using $Si_2H_6$ gas in the ultra high vacuum equipment, $Si_2H_6$ gas may be substituted by other gas such as $SiH_4$, $SiCl_2H_2$, etc., containing silicon with similar effect. Pressure in the forming apparatus is not always ultra high vacuum pressure. It is important, however, to heat the amorphous silicon film while a surface thereof being kept clean. It has been confirmed that similar phenomena to those occured in the described embodiment occur when the treatment is done within atmosphere of non-reactive gas to the amorphous silicon surface, such as nitrogen gas or helium gas. Heating is not limited to lamp heating so long as heating and cooling can be done rapidly. Further, although the natural oxide film of the amorphous silicon film formed by LPCVD is removed by washing it with aqueous solution of fluoric acid, the amorphous silicon film may be formed by MBE. Further, washing of the amorphous silicon film surface with other material than aqueous solution of fluoric acid may be used. It is essential that clean surface of the amorphous silicon film is subjected to gas containing silicon.

A third embodiment of the present invention will be described.

Figure 10A:
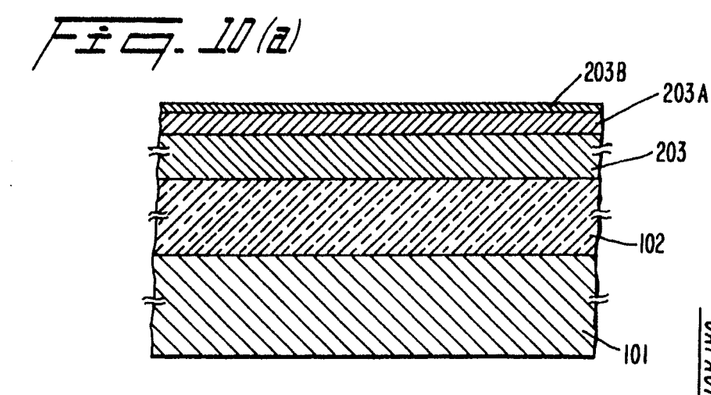
FIG. 10(a) is a cross section of a semiconductor chip for explaining a third embodiment of the present invention.
Figure 10B:
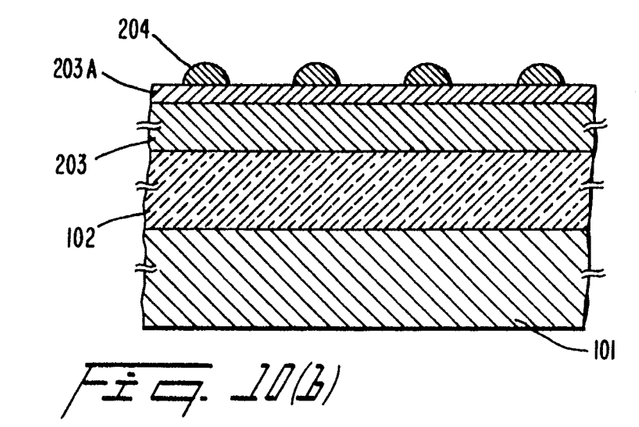
FIG. 10(b) is a cross section of a semiconductor chip for explaining a manufacturing step subsequent to that corresponding to FIG. 10(a)

As in the first embodiment or the second embodiment, a silicon oxide film 102 is formed on a surface of a silicon substrate 101 by thermal oxidation and then the substrate is inserted into a molecular beam epitaxy (MBE) apparatus and irradiated with silicon molecular beam from an electron gun type silicon evaporator at irradiation rate of 7 Å/sec and at room temperature to form an amorphous silicon film 4000 Å thick. Silicon molecular beam irradiation is stopped and the substrate is lamp-heated to a certain constant temperature in a range from 400° C. to about 500° C., at which thermal nucleation does not occur and irradiated with silicon molecular beam at irradiation rate of 1Å/sec. As illustrated in FIG. 10(a), there are a surface atom layer 203A and an adsorbed atom layer 203B in the amorphous silicon film 203 during this irradiation of silicon molecular beam. Although there is no nucleation, atoms in the surface atom layer 203A of the amorphous silicon film 203 diffuse in the surface with a certain activation energy E1. On the other hand, atoms in the adsorbed atom layer 203B also diffuse with activation energy E2 which is considerably smaller than E1. Therefore, adsorbed atoms nucleate in that surface regardless of low substrate temperature, resulting in fine crystal grains 204 as shown in FIG. 10(b). When the irradiation with silicon molecular is stopped while continuing heating, diffusing surface atoms are trapped by these crystal grains to grow the latter grains to a polysilicon film containing mushroom shaped crystal grains 105 as shown in FIG. 1(c). Thus, a polysilicon film having large surface area is formed. Then, a capacitor is formed in a similar manner to that described with reference to the second embodiment.

Figure 11:
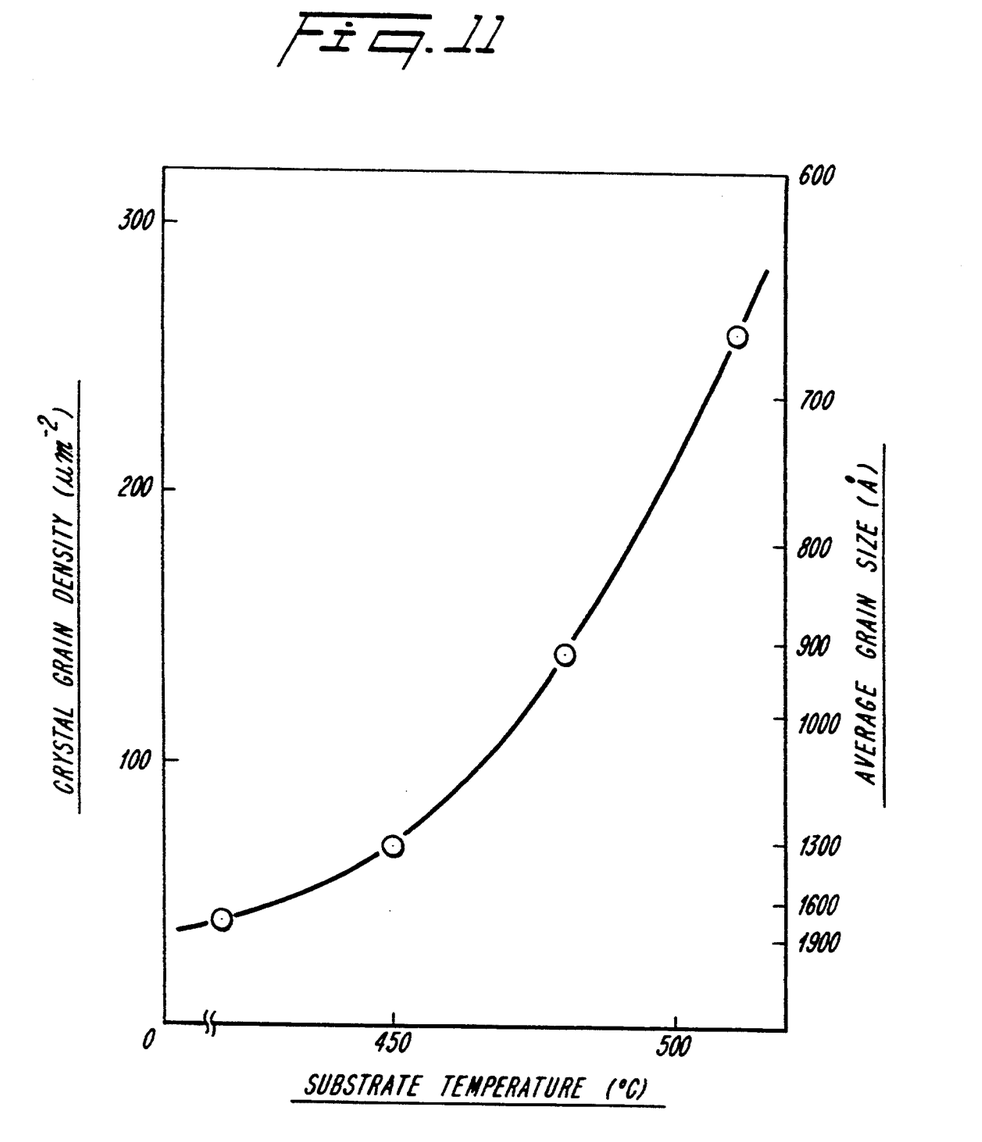
FIG. 11 is a graph showing a relation between crystal grain density and substrate temperature in the third embodiment of the present invention.

FIG. 11 is a graph showing a relation between substrate temperature and crystal grain density immediately after irradiation with silicon molecular beams with irradiation rate of 1 521 /sec for 50 seconds. From FIG. 11, it is clear that, with increase of the substrate temperature, crystal grain density is increased and crystal grain size is decreased. Average grain size in FIG. 11 is measured when grains become in contact with each other and there is no further grain size increase.

Figure 12:
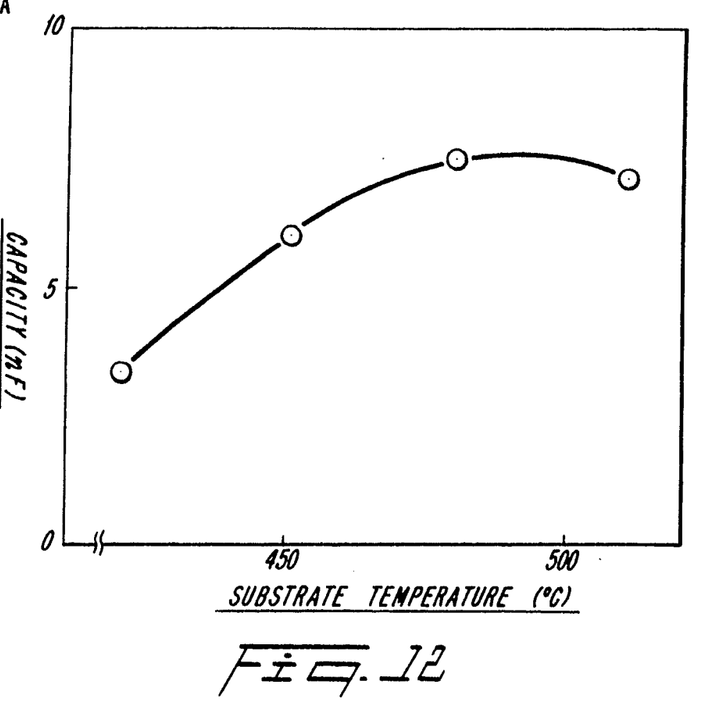
FIG. 12 is a graph showing a relation between capacitance value of a capacitor and substrate temperature in the third embodiment of the present invention.

FIG. 12 is a graph showing a relation of capacitance value of the capacitor and temperature of the substrate when it is irradiated at a rate 1 Å/sec. From this graph it is clear that the higher the substrate temperature, that is, the higher the crystal grain density, results in larger capacitance value. The capacitance value itself is larger compared with that for the polysilicon film formed by the conventional substrate heating method (cf. FIG. 3).

Figure 13:
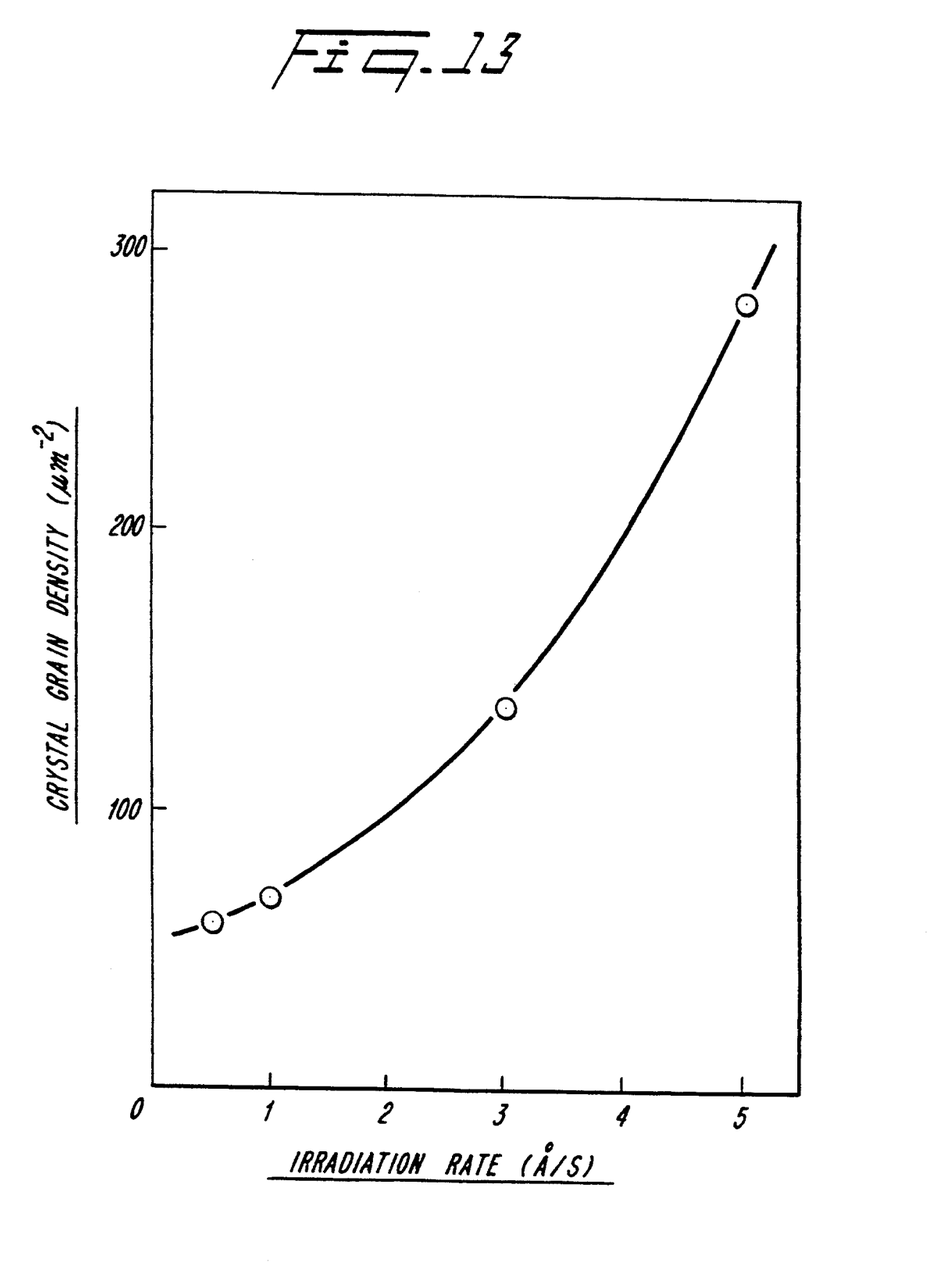
FIG. 13 is a graph showing a relation between crystal grain density and irradiation rate of molecular beam in the third embodiment of the present invention.
Figure 14:
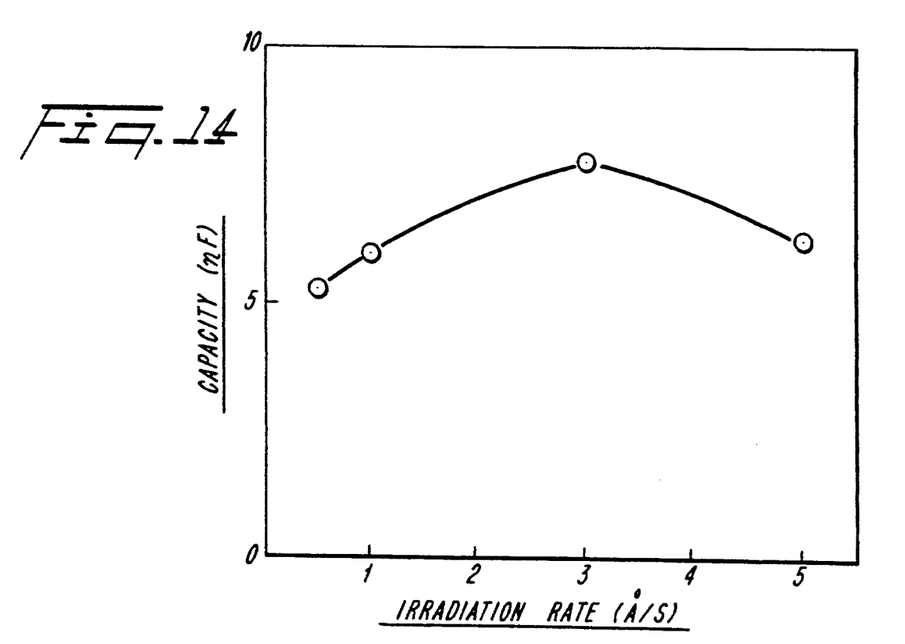
FIG. 14 is a graph showing a relation between capacitance value of a capacitor and irradiation rate of molecular beam in the third embodiment of the present invention.

FIG. 13 is a graph showing a relation of grain density immediately after irradiation of a substrate maintained at 450° C. with silicon molecular beam for 50 seconds to irradiation rate. This clearly shows that crystal grain size also depends upon irradiation density and can be sufficiently controlled by varying irradiation rate. FIG. 14 shows a graph showing a relation between capacitance value of capacitor and irradiation rate. It is clear from this figure that the higher the irradiation rate, that is, the higher the crystal grain size density, results in larger capacitance value. The capacitance value itself is larger compared with that for the polysilicon film formed by the conventional substrate heating method.

Figure 15:
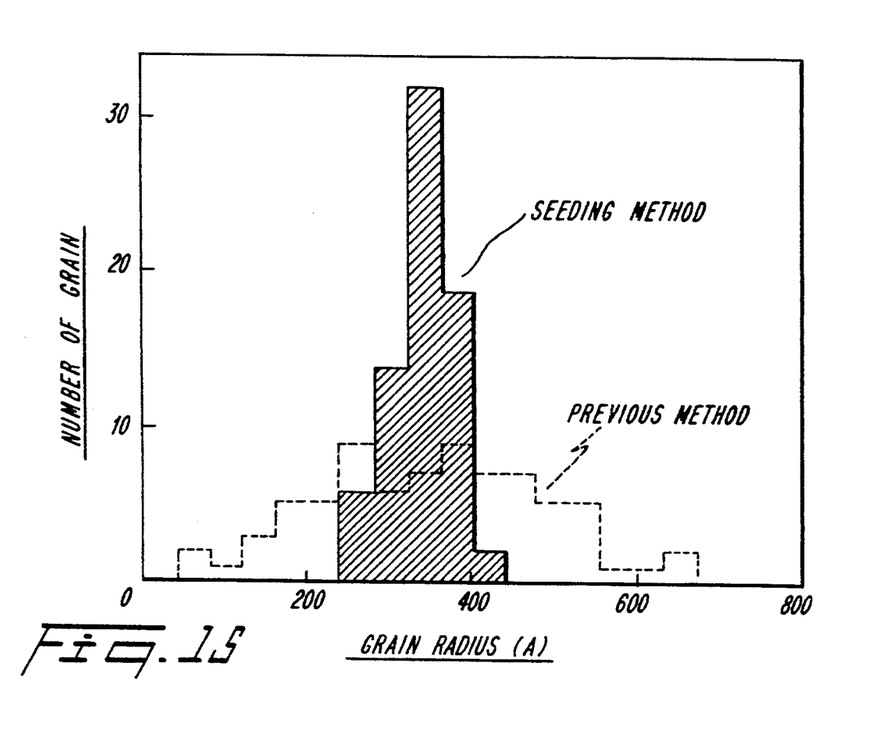
FIG. 15 is a graph showing a distribution of crystal grain size in the third embodiment of the present invention.

Grain size distribution is shown in FIG. 15. Data in FIG. 15 is obtained when a substrate maintained at 460° C. is irradiated with silicon molecular beam at 1 Å/sec for 30 seconds and then further heated for 60 minutes. For comparison purpose, data obtained when an amorphous silicon film is heated for 1 minute in vacuum is also shown. According to this embodiment, variation of crystal grain size is substantially reduced.

This embodiment makes a formation of polysilicon film at lower temperature compared with the second embodiment possible.

Although this embodiment has been described with reference to a silicon wafer, the present invention is also applicable to an SOS substrate in which silicon exists in only a surface region and even to an SOI substrate, generally. Further, although, in this embodiment, the amorphous silicon film is formed by using an electron gun type silicon evaporator in an MBE apparatus, similar effect was obtained for an amorphous silicon film prepared by LPCVD or sputtering method and having a surface whose natural oxide film is removed. Pressure in the forming apparatus is not always ultra high vacuum pressure. It is important, however, to heat the amorphous silicon film while a surface thereof being kept clean. It has been confirmed that similar phenomena to those occured in the described embodiment occur when the treatment is done within atmosphere of non-reactive gas to the amorphous silicon surface, such as nitrogen gas or helium gas.

Figure 16:
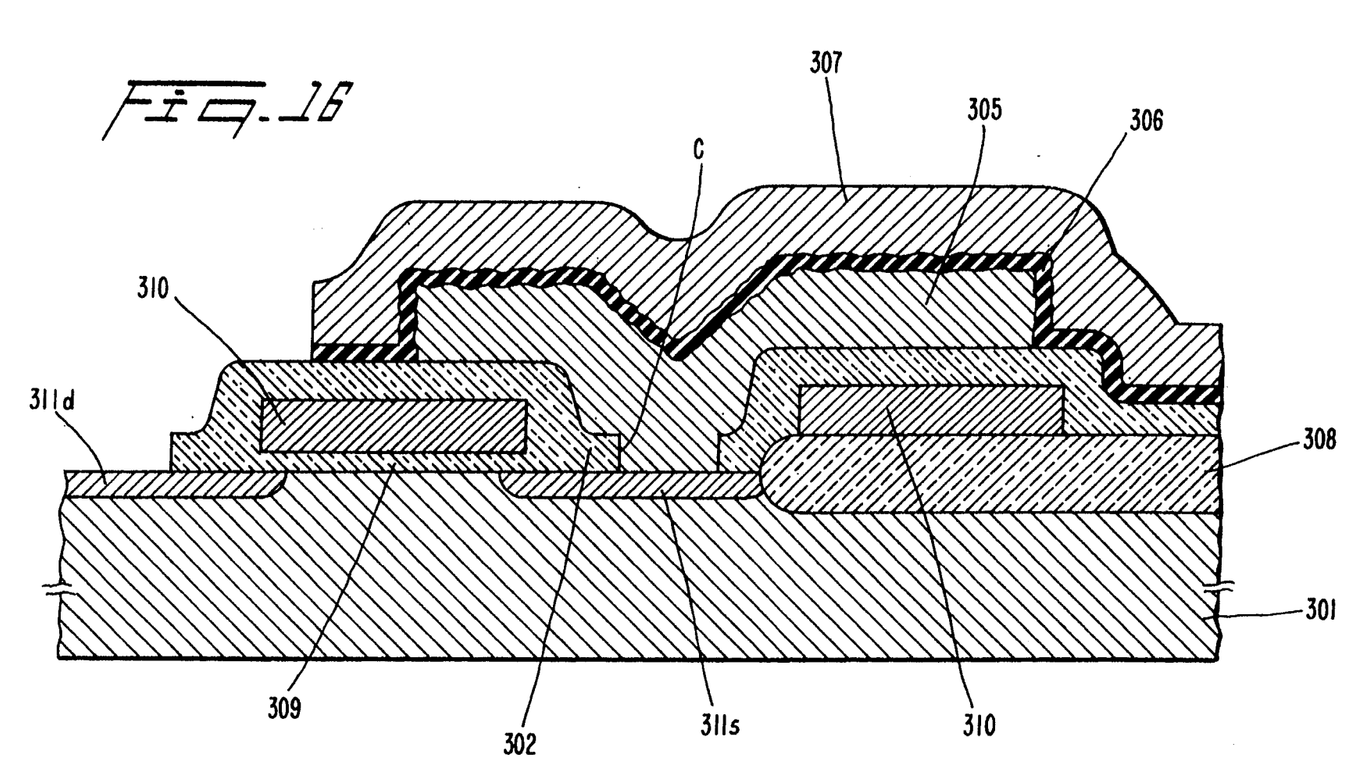
FIG. 16 is a cross section of a semiconductor chip showing a main portion of a DRAM formed according to the present invention.

Now, a semiconductor DRAM formed by applying the peesent invention will be described with reference to FIG. 16 showing a main portion of the DRAM cell.

A field oxide film 308 is formed on a surface of a P type silicon substrate 301 to isolate transistor forming regions from each other. A gate oxide film 309 is formed in a transistor forming region and gate electrodes 310 which also function as wordlines are formed across the transistor forming region. Then, ion implantation is performed to the forming region through the gate electrodes 310 and the field oxide film 308 as a mask to form N+ type diffusion layers 311s and 311d. Then, an interlayer insulating film 302 of silicon oxide is deposited through which a contact hole C is formed on the region 311s. On the wafer, an amorphous silicon film is deposited by LPCVD, etc., and, after patterning thereof, the wafer is washed with a mixture solution of $NH_3OH$, $H_2O_2$ and $H_2O$ and then a natural oxide film on the amorphous silicon film is removed by using fluoric acid solution. Then, the amorphous silicon film is converted into polysilicon film in a similar manner to that used in the second embodiment to form a capacitance storage electrode 305. In this conversion process, the amorphous silicon film is polycrystallized at a contact portion with the region 311s by solid phase epitaxy. However, since polycrystallization rate is low compared with polycrystallization by $Si_2H_6$ irradiation, there is no adverse effect on surface configuration of the capacitance storage electrode 305. Further, since the surface of the amorphous silicon film is exposed uniformly to $Si_2H_6$ gas, a desired, substantially uniform unevenness is obtained on the surface of the capacitance storage electrode 305 including its side wall. Then, a capacitor insulating film 306 is formed and a facing electrode 307 is formed with using the polysilicon film, etc. Thus, a capacitor connected to the region 311s of a MOS transistor can be formed, resulting in a high integration density DRAM.

When the third embodiment is to be applied to a formation of such DRAM, it is preferred that the storage electrode is formed by patterning following the polycrystallization immediately after the formation of amorphous silicon film. The reason for this is that, although it may be possible to form the polycrystallization after patterning, it is difficulty to obtain a satisfactory unevenness of the side wall of the electrode in view of directivity of molecular beam and, therefore, it is better to omit the step of removing the natural oxide film.

Although the present invention has been described with reference to specific embodiments, this description is not meant to be construed in a limited sense. Various modifications of the disclosed embodiments, as well as other embodiments of the present invention, will become apparent to person skilled in the art upon reference to the description of the present invention. It is therefore contemplated that appended claims will cover any modifications or embodiments as fall within the scope of the present invention.

What is claimed is:

1. A method of fabricating a semiconductor device, comprising the steps of:
    forming a capacitance electrode made of a polysilicon film, said polysilicon film being formed by recrystallizing an amorphous silicon film, said recrystallizing being performed by depositing said amorphous silicon film on an insulating film covering a semiconductor substrate, generating a plurality of crystal nuclei at a plurality of portions of a substantially cleaned surface of said amorphous silicon film, respectively, and growing each of said plurality of crystal nuclei into a mushroom or hemisphere shaped crystal grain to thereby convert said amorphous silicon film into said polysilicon film, said polysilicon film thereby having a concavo-convex surface caused by said mushroom or hemisphere shaped crystal grains being separated apart from one another;

forming a dielectric film on said concavo-convex surface of said polysilicon film, said dielectric film thereby having a concavo-convex surface; and forming another capacitance electrode by forming a conductive film on said concavo-convex surface of said dielectric film.

2. The method claimed in claim 1, wherein said crystal nuclei are produced by heating said semiconductor chip temperature in vacuum or in a gas substantially chemically non-reactive to said amorphous silicon film and said crystal growing is performed at a lower temperature.

3. A method of fabricating a semiconductor device, comprising the steps of:

forming a capacitance electrode made of a polysilicon film, said polysilicon film being formed by recrystallizing an amorphous silicon film, said recrystallizing being performed by depositing said amorphous silicon film on an insulating film covering a semiconductor substrate, applying heat in vacuum or in a gas substantially chemically non-reactive to said amorphous silicon film while supplying a silicon-containing compound to produce crystal nuclei and continuing to apply said heat after terminating said supply of said compound gas to grown said crystal nuclei;

forming a dielectric film on said polysilicon film; and forming another capacitance electrode by forming a conductive film on said dielectric film.

4. The method claimed in claim 3, wherein said nucleation step is performed by patterning said amorphous silicon film in atmospheric environment, washing said patterned amorphous silicon film with fluoric acid solution, during the amorphous silicon film and supplying $Si_2H_6$ gas.

5. The method claimed in claim 1, wherein said nucleation is performed in vacuum by heating said amorphous silicon film and irradiating said amorphous silicon film with a silicon molecular beam and said crystal growth is performed by terminating said irradiation of silicon molecular beam and continuing said heating.

6. The method as claimed in claim 1, wherein said crystal nuclei are generated by applying heat in an atmosphere including a silicon-containing compound gas.

7. The method as claimed in claim 6, wherein said crystal nuclei are grown in an atmosphere free from said silicon-containing compound gas.

* * * * *